US012751067B2

(12) United States Patent
Inoue et al.

(10) Patent No.: US 12,751,067 B2
(45) Date of Patent: Sep. 29, 2026

(54) SEMICONDUCTOR DEVICE AND METHOD OF MANUFACTURING SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Emiko Inoue, Nonoichi Ishikawa (JP); Motoya Kishida, Kanazawa Ishikawa (JP); Shigeaki Hayase, Himeji Hyogo (JP); Kazushi Maeda, Tatsuno Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 620 days.

(21) Appl. No.: 17/901,312

(22) Filed: Sep. 1, 2022

(65) Prior Publication Data

US 2023/0307513 A1 Sep. 28, 2023

(30) Foreign Application Priority Data

Mar. 23, 2022 (JP) ................................ 2022-047433

(51) Int. Cl.
*H10D 64/00* (2025.01)
*H10D 64/01* (2025.01)

(52) U.S. Cl.
CPC ........... *H10D 64/118* (2025.01); *H10D 64/01* (2025.01); *H10D 64/111* (2025.01)

(58) Field of Classification Search
CPC ..... H10D 64/118; H10D 64/01; H10D 64/111
See application file for complete search history.

(56) References Cited

U.S. PATENT DOCUMENTS 5,552,625 A 9/1996 Murakami
9,991,212 B2 6/2018 Fujii
(Continued)

FOREIGN PATENT DOCUMENTS

JP H06-268198 A 9/1994
JP 2012-069634 A 4/2012
(Continued)

OTHER PUBLICATIONS

Japanese Office Action mailed May 20, 2025 in corresponding Japanese Patent Application 2022-074433, 8 pages.

*Primary Examiner* — Monica D Harrison
*Assistant Examiner* — Woo K Lee
(74) *Attorney, Agent, or Firm* — Kim & Stewart LLP

(57) ABSTRACT

A semiconductor device includes a semiconductor layer, a conductive film, a first insulating film, and a second insulating film. The semiconductor layer has an element region where a semiconductor element is provided and a termination region surrounding the element region. The conductive film is provided on the element region and the termination region. The first insulating film is provided on the conductive film on the termination region and a portion of the element region adjacent to the termination region. The second insulating film that is lower in resistivity than the first insulating film, and higher in resistivity than the conductive film, is provided on the first insulating film.

20 Claims, 13 Drawing Sheets

(56) References Cited

U.S. PATENT DOCUMENTS

| | | | | |
|---|---|---|---|---|
| 2012/0068310 | A1* | 3/2012 | Uemura | H01L 23/58 257/E29.198 |
| 2014/0035124 | A1* | 2/2014 | Kamijo | H01L 23/562 257/734 |
| 2021/0233873 | A1 | 7/2021 | Ito et al. | |
| 2025/0112103 | A1 | 4/2025 | Ebihara | |

FOREIGN PATENT DOCUMENTS

| | | | | |
|---|---|---|---|---|
| JP | 2014-033053 | A | | 2/2014 |
| JP | 5921784 | B2 | | 5/2016 |
| JP | 2017017145 | A | * | 1/2017 |
| JP | 2018120930 | A | * | 8/2018 |
| JP | 6575398 | B2 | | 9/2019 |
| WO | 2020105097 | A1 | | 5/2020 |
| WO | 2021064944 | A1 | | 4/2021 |
| WO | 2023007650 | A1 | | 2/2023 |

* cited by examiner

SEMICONDUCTOR DEVICE AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2022-047433, filed Mar. 23, 2022, the entire contents of which are incorporated herein by reference.

FIELD

Embodiments described herein relate generally to a semiconductor device and a method of manufacturing a semiconductor device.

BACKGROUND

In a termination structure of a power semiconductor, a semi-insulating film (semi-insulating silicon nitride film, i.e., SInSiN film) is often provided on a metal film such as an electrode and an interconnection for ensuring a breakdown voltage. However, a reaction of the metal in the metal film with Si in the semi-insulating film during formation of the semi-insulating film possibly causes an increase in conductivity of the semi-insulating film and generates short-circuits in the electrode and the interconnection.

DETAILED DESCRIPTION

Embodiments provide a semiconductor device and a method of manufacturing a semiconductor device capable of preventing an increase in conductivity of a semi-insulating film.

In general, according embodiment, a to one semiconductor device includes a semiconductor layer, a conductive film, a first insulating film, and a second insulating film. The semiconductor layer has an element region where a semiconductor element is provided and a termination region surrounding the element region. The conductive film is provided on the element region and the termination region. The first insulating film is provided on the conductive film on the termination region and a portion of the element region adjacent to the termination region. The second insulating film having a resistivity lower than a resistivity of the first insulating film and higher than a resistivity of the conductive film, is provided on the first insulating film.

First Embodiment

Figure 1:
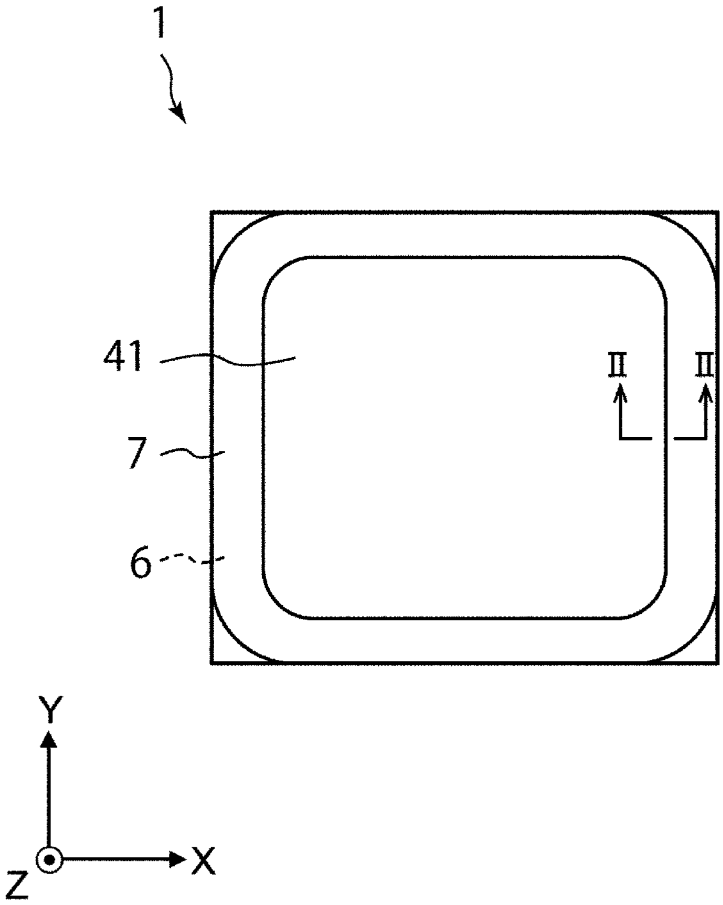
FIG. 1 is a plan view illustrating a semiconductor device according to a first embodiment.
Figure 2A:
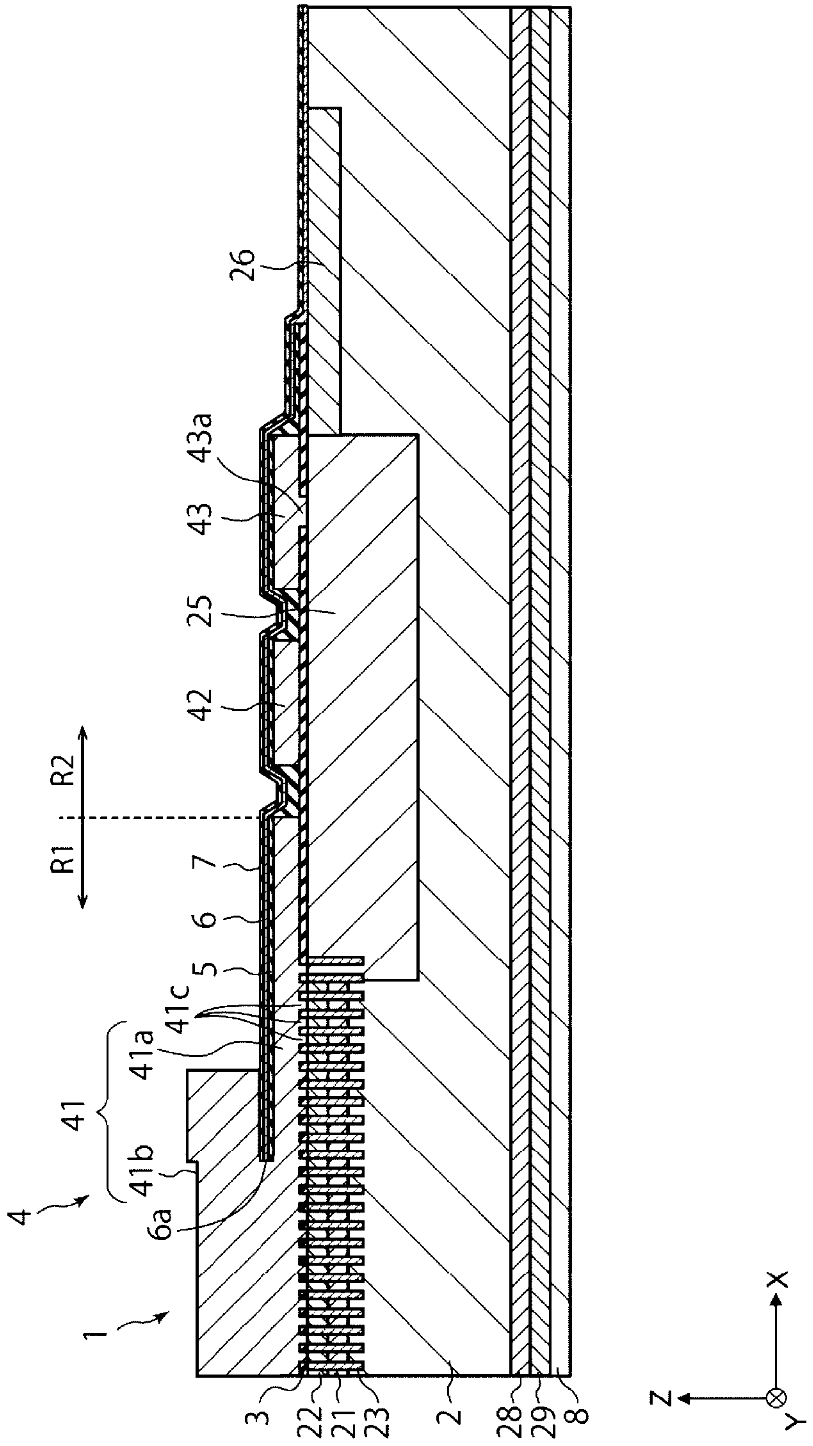
FIG. 2A is a cross-sectional view illustrating the semiconductor device according to the first embodiment.

Hereinafter, a first embodiment of the disclosure will be described with reference to the drawings. FIG. 1 is a plan view illustrating a semiconductor device 1 according to the first embodiment. FIG. 2A is a cross-sectional view illustrating the semiconductor device 1 according to the first embodiment. FIG. 2A is a cross-sectional view of a cross-section taken along line II-II of FIG. 1.

The first embodiment will be described with a case where a first conductive type is an N type and a second conductive type is a P type as an example. Furthermore, in the following descriptions, notations of N−, N+, N, P−, P+, and P indicate relative relationships among impurity concentrations of the conductive types. That is, it is indicated that N+ is relatively higher in impurity concentration of the N type than N and that N− is relatively lower in impurity concentration of the N type than N. In addition, it is indicated that P+ is relatively higher in impurity concentration of the P type than P and that P− is relatively lower in impurity concentration of the P type than P. It is noted that N+ type and N-type may be simply denoted as "N type" and that P+ type and P− type may be simply denoted as "P type."

An IGBT (Insulated Gate Bipolar Transistor), for example, is an example of a semiconductor device 1 according to the first embodiment. The semiconductor device 1 also may be an FRD (Fast Recovery Diode) (refer to FIG. 12). As illustrated in FIG. 2A, the semiconductor device 1 includes a semiconductor layer 2, an interlayer insulating film 3, a conductive film 4, a first insulating film 5, an SInSiN film (referred to herein as a second insulating film) 6, a SiN film (referred to herein as a third insulating film) 7, and a collector electrode 8. The conductive film 4 has an emitter electrode 41, a gate interconnection 42, and a field plate 43.

Figure 2B:
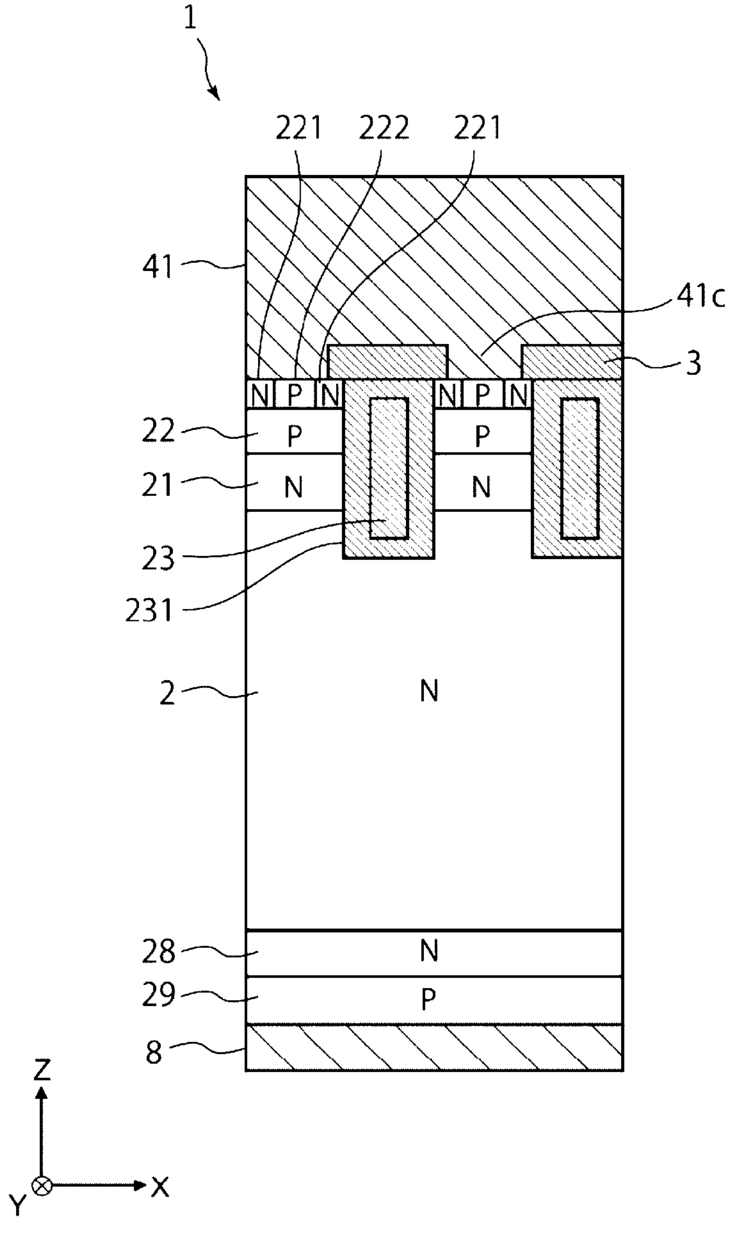
FIG. 2B is a partial enlarged cross-sectional view of the semiconductor device of FIG. 2A.

In the following descriptions, a direction from the collector electrode 8 to the semiconductor layer 2 is defined as a Z direction. Furthermore, a direction orthogonal to the Z direction is defined as an X direction, and a direction orthogonal to the X direction and the Z direction is defined as a Y direction. FIG. 1 is a plan view of the semiconductor device 1 on an X-Y plane. FIGS. 2A and 2B illustrate the cross-sectional views of the semiconductor device 1 on an X-Z plane. While the X direction, the Y direction, and the Z direction have an orthogonal relationship in the present embodiment, the relationship is not limited to the orthogonal relationship and may be a relationship that these directions cross one another. In the following descriptions, the direction from the collector electrode 8 to the semiconductor layer 2 is referred to as an "upper" direction and an opposite direction is referred to as a "lower" direction.

As illustrated in FIG. 1, the semiconductor layer 2 has an element region R1 provided with a semiconductor element, i.e., a transistor that has the semiconductor layer 2, a gate electrode 23 to be described later, the emitter electrode 41, and the collector electrode 8, and a termination region R2 surrounding the element region R1. The semiconductor layer 2 contains an N type impurity. As illustrated in FIG. 2A, an impurity layer (also referred to herein as a barrier layer) 21 containing an N type impurity at a concentration (N) higher than a concentration (N−) of the N type impurity contained in the semiconductor layer 2 is provided on the element region R1 of the semiconductor layer 2. Providing the barrier layer 21 higher in N type impurity concentration than the semiconductor layer 2 on a side closer to the emitter electrode 41 limits emission of holes in the semiconductor layer 2 to the emitter electrode 41 when the semiconductor device 1 is in an ON state. Therefore, a carrier concentration of the semiconductor layer 2 on a side closer to the emitter electrode 41 becomes higher. An ON resistance of the semiconductor device 1, therefore, decreases. In the other embodiments, however, it is not necessary to provide the impurity layer 21. A well layer 22 containing a P type impurity is provided on the impurity layer 21.

FIG. 2B is a partial enlarged cross-sectional view of FIG. 2A. In FIG. 2B, conductive types of the semiconductor layer 2 and impurity regions provided in the semiconductor layer 2 are illustrated. As illustrated in FIG. 2B, emitter layers 221 containing an N type impurity and contact layers 222 containing a P type impurity are selectively provided on the well layer 22. In the element region R1, the emitter layers 221 and the contact layers 222 come in ohmic contact with the emitter electrode 41. More specifically, the emitter layers 221 and the contact layer 222 come in ohmic contact with the emitter electrode 41 via contacts 41*c* of the emitter electrode 41, which penetrate the interlayer insulating film 3. Furthermore, a gate electrode 23 that penetrates the well layer 22 and the impurity layer 21 from an upper surface of the semiconductor layer 2 into the semiconductor layer 2, i.e., a drift region, is provided in the element region R1 of the semiconductor layer 2. A plurality of gate electrodes 23 are provided apart from one another in the X direction. Each gate electrode 23 extends in the Y direction. A gate insulating film 231 is provided on side surfaces of the gate electrode 23. That is, in the X direction, each gate electrode 23 faces the well layer 22 through the gate insulating film 231. In the illustrated example, the gate electrode 23 also faces part of each emitter layer 221, the impurity layer 21, and part of the semiconductor layer 2 through the gate insulating film 231. The gate electrode 23 is electrically insulated from the emitter electrode 41 by the gate insulating film 231 and the interlayer insulating film 3 to be described later. In FIG. 2A, the gate insulating film 231 is not illustrated.

Furthermore, a guard ring 25 containing a P type impurity is provided on the semiconductor layer 2 from an outer edge of the element region R1 to an inner edge of the termination region R2 to surround the element region R1. A concentration (P+) of the P type impurity in the guard ring 25 is higher than a concentration (P) of the P type impurity in the well layer 22. By providing the guard ring 25, it is possible to prevent generation of electric field concentration in on an outermost periphery of a bottom portion of the gate electrode 23 and effectively maintain a breakdown voltage of the semiconductor device 1.

Furthermore, a RESURF region 26 containing a P type impurity at a concentration (P−) lower than the concentration (P+) of the P type impurity in the guard ring 25 is provided in the termination region R2 outside of the guard ring 25 on the semiconductor layer 2. The RESURF region 26 surrounds the element region R1. The RESURF region 26 contacts an outer edge of the guard ring 25. By providing the RESURF region 26, it is possible to mitigate an electric field of the outer edge of the guard ring 25 and maintain the breakdown voltage of the semiconductor device 1 more effectively.

Furthermore, a buffer layer 28 containing an N type impurity at a concentration (N) higher than the concentration (N−) of the N type impurity contained in the semiconductor layer 2 is provided under the semiconductor layer 2. The buffer layer 28 functions to prevent an extension of a depletion layer when the semiconductor device 1 is in an OFF state. A collector layer 29 containing a P type impurity is provided under the buffer layer 28. The collector electrode 8 is provided on a lower surface of the semiconductor layer 2 to contact the collector layer 29. The collector electrode 8 is electrically connected to the collector layer 29.

The interlayer insulating film 3 is provided partially on the semiconductor layer 2 to contact an upper surface of the semiconductor layer 2. In the example illustrated in FIG. 2A, the interlayer insulating film 3 is provided partially on the semiconductor layer 2 except for positions at which the contacts 41*c* of the emitter electrode 41 are provided, positions at which contacts 43*a* of the field plate 43 to be described later are provided, and a position at which a portion of the SInSiN film 6 that directly contacts the upper surface of the semiconductor layer 2 is provided. The interlayer insulating film 3 may be, for example, a silicon oxide film.

The conductive film 4 includes the emitter electrode 41, the gate interconnection 42, and the field plate 43. The conductive film 4 is provided on the interlayer insulating film 3 and on the semiconductor layer 2.

The emitter electrode 41 is provided on the interlayer insulating film 3 and the semiconductor layer 2 in the element region R1. The emitter electrode 41 has an outer edge part 41*a* provided on a side closer to the termination region R2 and a central part 41*b* provided on a side closer to the element region R1. The outer edge part 41*a* of the emitter electrode 41 is provided between the interlayer insulating film 3 and the semiconductor layer 2, and the first insulating film 5 to be described later. Part of the central part 41*b* of the emitter electrode 41 is provided on the SiN film 7, to be described later, on the side closer to the termination region R2. As illustrated in FIG. 2A, the outer edge part 41*a* of the emitter electrode 41 is thinner than the central part 41*b* of the emitter electrode 41 in the Z direction. The emitter electrode 41 is, for example, an aluminum electrode.

The gate interconnection 42 is provided on the interlayer insulating film 3 in the termination region R2. The gate interconnection 42 is provided outside of the emitter electrode 41 to be apart from the emitter electrode 41. The gate interconnection 42 surrounds the element region R1 along an outer peripheral edge of the element region R1. The gate interconnection 42 is electrically connected to the gate electrode 23 in a Y-direction end portion of the gate electrode 23. The gate interconnection 42 is connected to a gate pad, not illustrated. The gate interconnection 42 is electrically isolated from the emitter electrode 41 by the interlayer insulating film 3. The gate interconnection 42 is, for example, an aluminum electrode.

The field plate 43 is provided outside of the gate interconnection 42 to be apart from the gate interconnection 42 in the termination region R2. The field plate 43 surrounds the element region R1 along the outer peripheral edge of the element region R1. The field plate 43 contacts the guard ring 25 via the contact 43*a* penetrating the interlayer insulating film 3. The field plate 43 accelerates the extension of the depletion layer on the upper surface of the semiconductor layer 2. The field plate 43 is, for example, an aluminum electrode.

The first insulating film 5 is provided on the conductive film 4 on the termination region R2 and a portion of the element region R1 adjacent to the termination region R2. That is, the first insulating film 5 is provided on the termination region R2 and an outer edge of the element region R1. The first insulating film 5 is, for example, a silicon oxide film. The silicon oxide film may be a tetraethyl orthosilicate film (TEOS film).

The SInSiN film 6 is provided on the first insulating film 5. The SInSiN film 6 is a semi-insulating silicon nitride film lower in resistivity than the first insulating film 5 and higher in resistivity than the conductive film 4. The resistivity of the SInSiN film 6 may be higher than a resistivity of the drift region of the semiconductor layer 2. A side wall 6*a* of the SInSiN film 6 on the side closer to the element region R1 is connected to, i.e., in contact with the emitter electrode 41 in the X direction. The SInSiN film 6 is provided on the termination region R2 outside of the conductive film 4 and the first insulating film 5. That is, the SInSiN film 6 is provided on the first insulating film 5 and on a portion of the semiconductor layer 2 farther from the element region R1 than the first insulating film 5. An end portion of the SInSiN film 6 on a side closer to the termination region R2 is connected to, for example, an EQPR (Equipotential Ring) electrode, not illustrated. A potential of the SInSiN film 6, which is connected to the emitter electrode 41, is maintained identical to a potential of the emitter electrode 41. The SInSiN film 6 can thereby mitigate the electric field concentration and maintain the breakdown voltage of the semiconductor device 1 more effectively. The SInSiN film 6 contacts the upper surface of the semiconductor layer 2 on the semiconductor layer 2 apart from the element region R1 and outside of the first insulating film 5. That is, the SInSiN film 6 outside of the first insulating film 5 directly contacts the upper surface of the semiconductor layer 2. Direct contact of the SInSiN film 6 with the semiconductor layer 2 makes it possible to stably maintain the breakdown voltage of the semiconductor device 1.

The SiN film 7 is provided on the SInSiN film 6. The first insulating film 5, the SInSiN film 6, and the SiN film 7 each have an edge provided between the outer edge part 41*a* of the emitter electrode 41 and part of the central part 41*b* of the emitter electrode 41 on the side closer to the element region R1.

Next, a method of driving the semiconductor device 1 according to the first embodiment will be described. In the element region R1, when a control voltage equal to or higher than a threshold voltage is applied to the gate electrode 23 in a state in which a high voltage is applied to the collector electrode 8 and a low voltage is applied to the emitter electrode 41, an inversion layer (n channel) is formed near an interface of the well layer 22 with the gate insulating film 231. By forming the inversion layer, electrons are injected into the semiconductor layer 2 via the inversion layer from the emitter layers 221 to turn on the transistor. At this time, holes are also injected into the semiconductor layer 2 from the collector layer 29, reducing a resistance of the semiconductor layer 2. A current thereby flows from the collector electrode 8 to the emitter electrode 41. On the other hand, when the control voltage is lower than the threshold voltage, the inversion layer formed near the interface of the well layer 22 with the gate insulating film 231 disappears. Because of this, electron injection into the semiconductor layer 2 from the emitter layers 221 and hole injection into the semiconductor layer 2 from the collector layer 29 are stopped. Subsequently, emission of electrons from the emitter layers 221 to the semiconductor layer 2 and emission of holes from the collector layer 29 into the semiconductor layer 2 are continued to make the semiconductor layer 2 become depleted. The semiconductor device 1 thereby goes into an Off state.

Next, a method of manufacturing the semiconductor device 1 according to the first embodiment will be described. In the following descriptions, a method of manufacturing an upper surface-side structure of the semiconductor layer 2 will be described while a method of manufacturing a lower surface-side structure of the semiconductor layer 2 will not be described.

Figure 3:
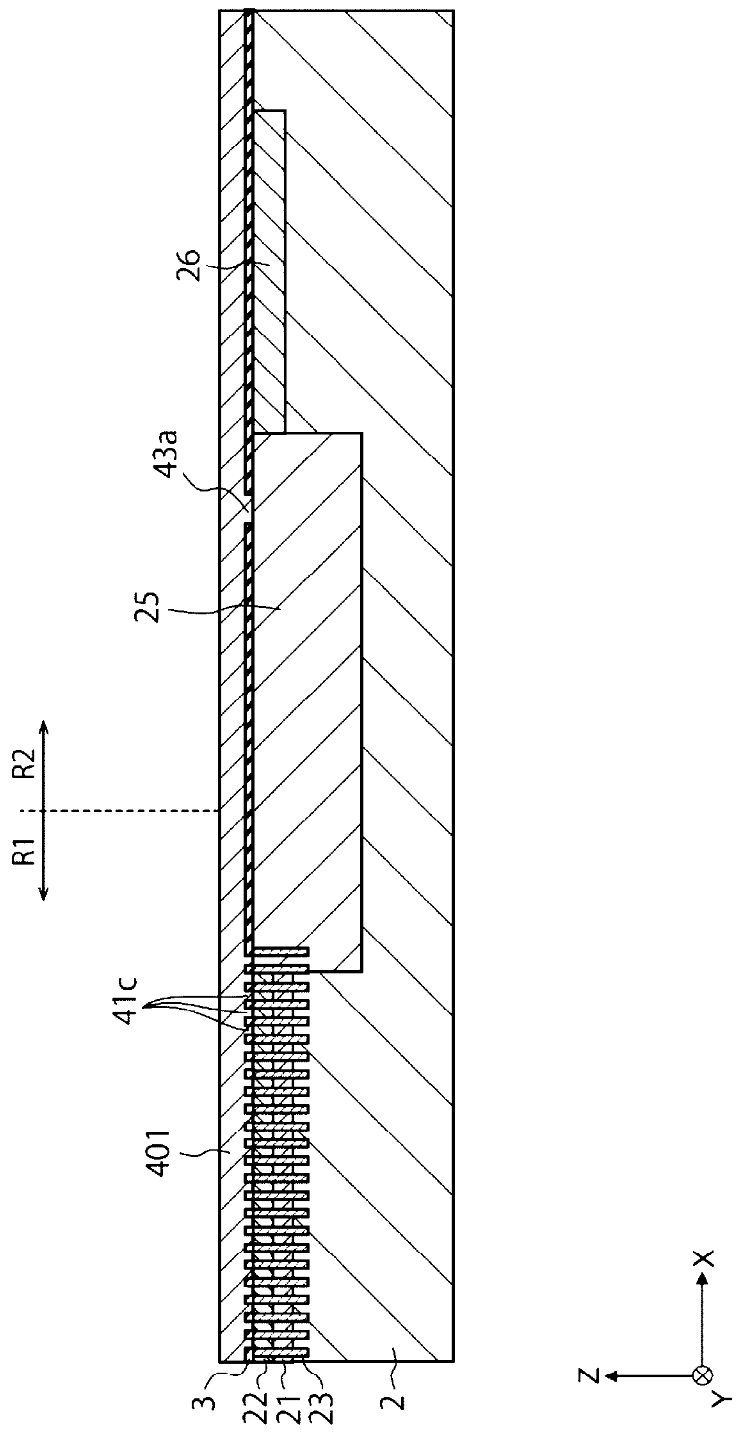
FIGS. 3-8 are cross-sectional views illustrating a method of manufacturing the semiconductor device according to the first embodiment.

FIG. 3 is a cross-sectional view illustrating the method of manufacturing the semiconductor device 1 according to the first embodiment. In FIG. 3, the semiconductor layer 2 and the impurity regions are already formed. First, as illustrated in FIG. 3, the interlayer insulating film 3 is formed on the upper surface of the semiconductor layer 2, i.e., upper surfaces of the impurity layers 22, 25 and 26. Formation of the interlayer insulating film 3 is performed by, for example, chemical vapor deposition (CVD) method. After forming the interlayer insulating film 3, the interlayer insulating film 3 is processed so that part of the emitter layers 221, part of the contact layers 222, and part of the guard ring 25 are exposed. Processing of the interlayer insulating film 3 is performed by, for example, etching using a resist film having a pattern formed by photolithography, as a mask. After processing the interlayer insulating film 3, a first conductive film 401 is formed on the interlayer insulating film 3 and on the exposed semiconductor layer 2, i.e., on part of the emitter layers 221, part of the contact layers 222, and part of the guard ring 25. The formation of the first conductive film 401 is performed by, for example, sputtering.

Figure 4:
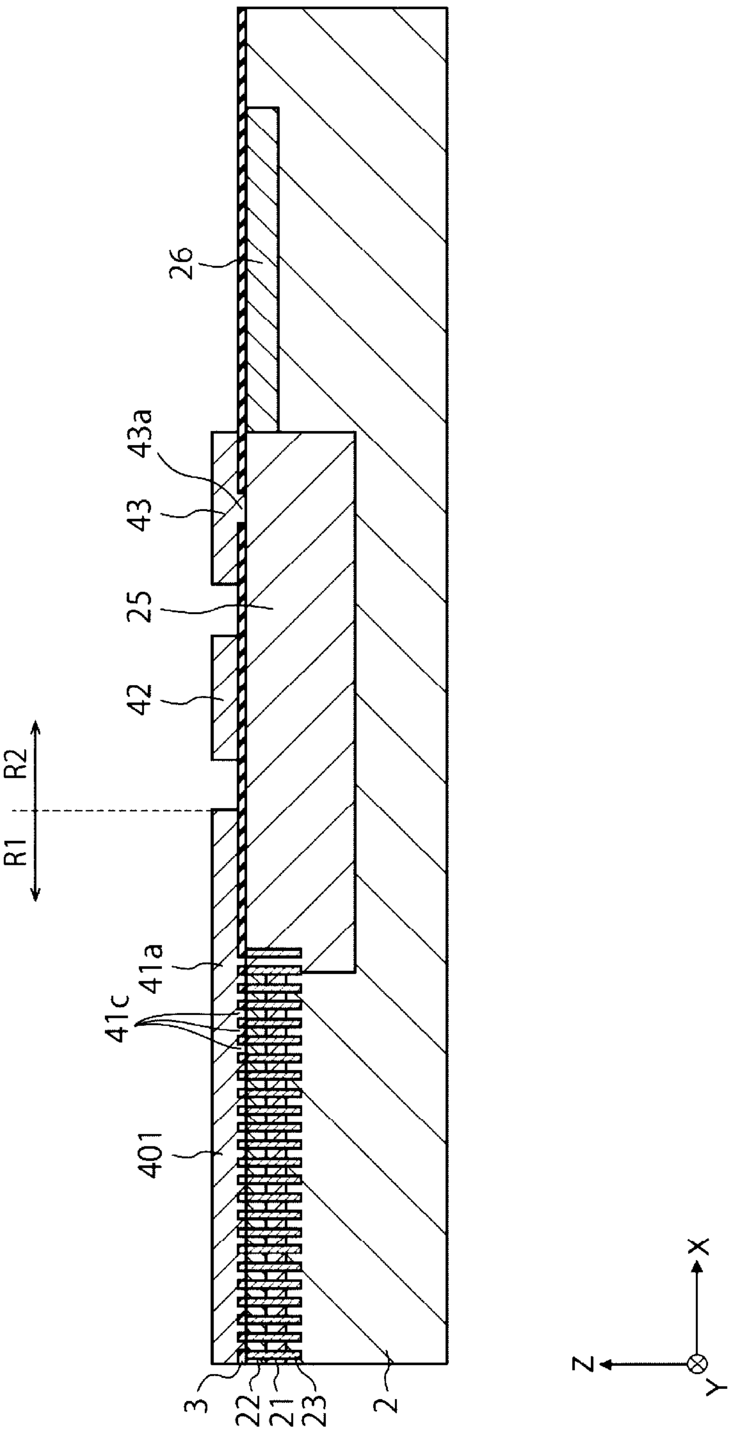

FIG. 4 is a cross-sectional view illustrating the method of manufacturing the semiconductor device 1 according to the first embodiment subsequent to the process described in conjunction with FIG. 3. After forming the first conductive film 401, etching is performed using the resist film having the pattern formed by, for example, photolithography, as a mask. Specifically, the first conductive film 401 located near a boundary between the element region R1 and the termination region R2 is etched to form part of the emitter electrode 41 in the element region R1. In addition, part of the first conductive film 401 is also etched in the termination region R2 to form the gate interconnection 42 and the field plate 43 in this order in a direction from the element region R1 to the termination region R2. Through processes described above, part of the emitter electrode 41, the gate interconnection 42, and the field plate 43 illustrated in FIG. 4 are formed. It is noted that part of the emitter electrode 41 closest to the termination region R2 becomes the outer edge part 41*a*. Moreover, the first conductive film 401 located on an outermost periphery, i.e., on a side closer to the termination region R2 than the field plate 43 is also etched to expose the interlayer insulating film 3, thus forming a region to which the SInSIN film 6, to be described later, is directly attached.

Figure 5:
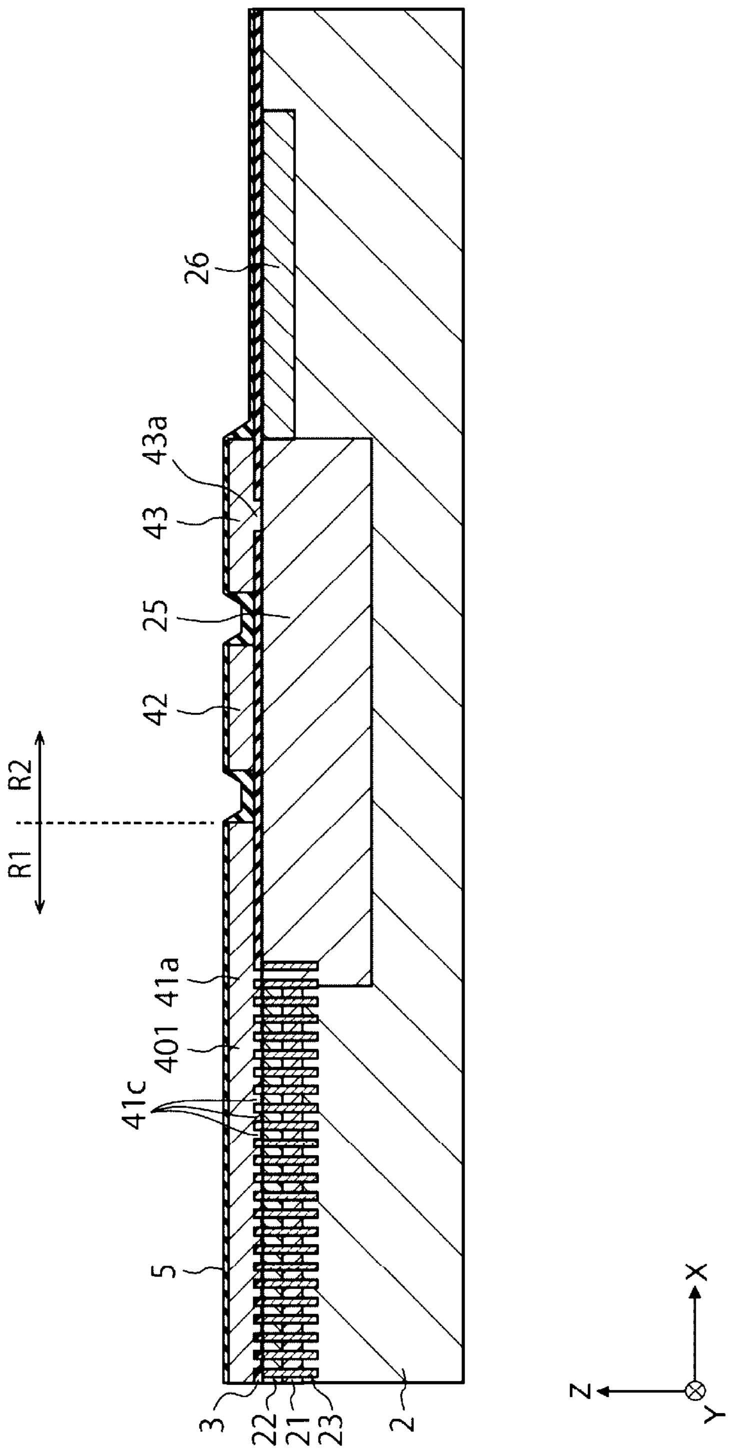

FIG. 5 is a cross-sectional view illustrating the method of manufacturing the semiconductor device 1 according to the first embodiment subsequent to the process described in conjunction with FIG. 4. After processing the first conductive film 401, the first insulating film 5 is formed on the first conductive film 401 and the interlayer insulating film 3 exposed from the first conductive film 401, as illustrated in FIG. 5.

Figure 6:
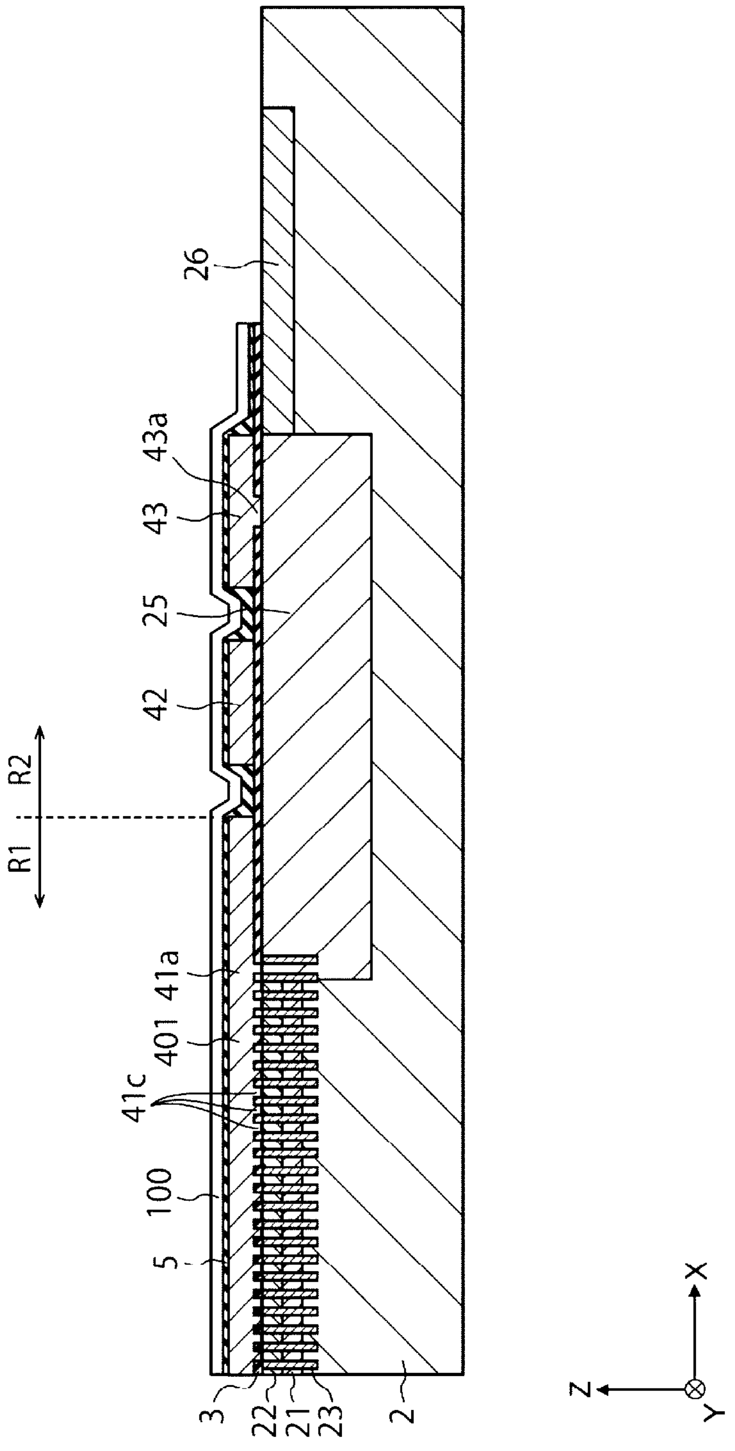

FIG. 6 is a cross-sectional view illustrating the method of manufacturing the semiconductor device 1 according to the first embodiment subsequent to the process described in conjunction with FIG. 5. After forming the first insulating film 5, the interlayer insulating film 3 and the first insulating film 5 are processed so as to expose the upper surface of the semiconductor layer 2 in a range corresponding to the part to which the SInSiN film 6 is directly attached, i.e., the upper surface of the semiconductor layer 2 located at the side closer to the termination region R2 than the field plate 43, as illustrated in FIG. 6. Specifically, a resist film 100 is formed on the first insulating film 5. After forming the resist film 100, a pattern is formed in the resist film 100 in such a manner as to expose the first insulating film 5 in the range corresponding to the part to which the SInSiN film 6 is directly attached, using the photolithography. After forming the pattern, the first insulating film 5 and the interlayer insulating film 3 are etched using the resist film 100 in which the pattern is formed, as a mask.

Figure 7:
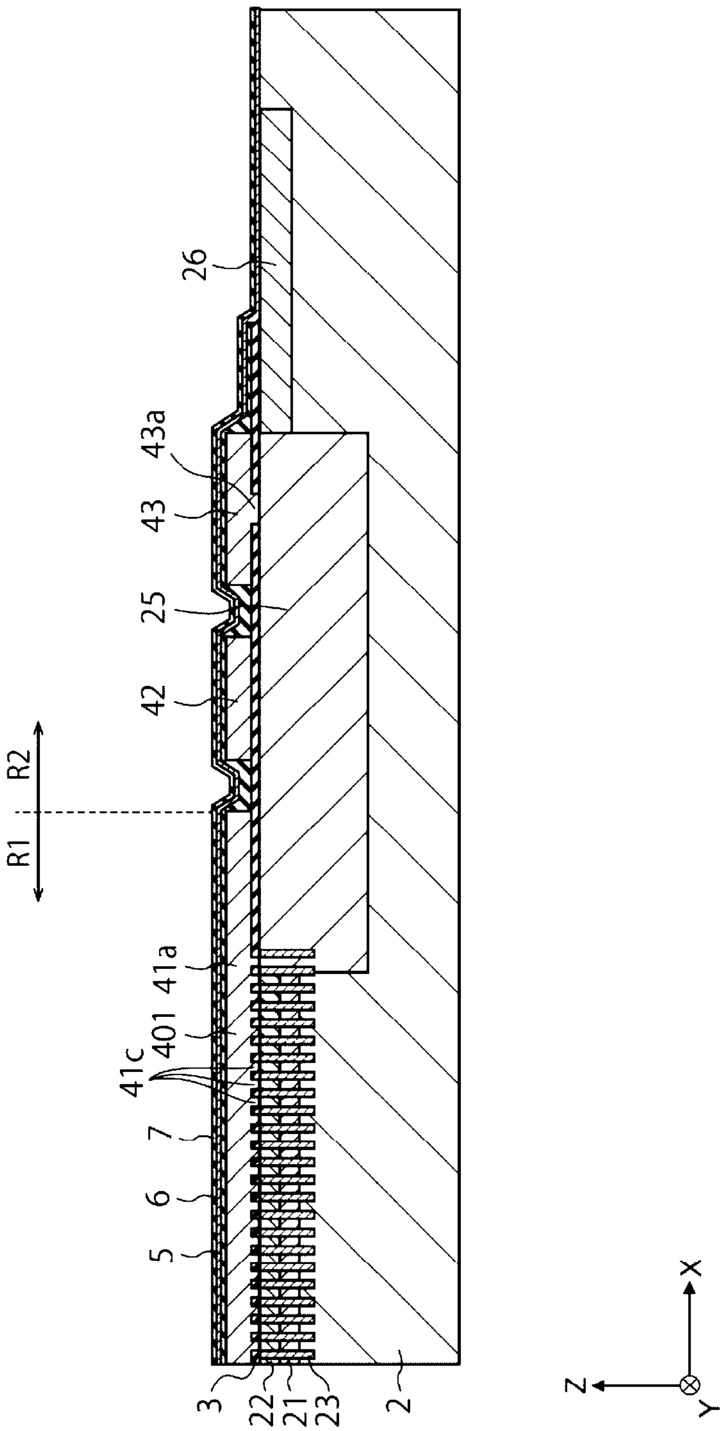

FIG. 7 is a cross-sectional view illustrating the method of manufacturing the semiconductor device 1 according to the first embodiment subsequent to the process described in conjunction with FIG. 6. After processing the interlayer insulating film 3 and the first insulating film 5, the semiconductor layer 2 is cleaned with a diluted hydrofluoric acid. After cleaning the semiconductor layer 2, the SInSiN film 6 is formed on the first insulating film 5, on the RESURF region 26 exposed through the first insulating film 5, and on the upper surface of the semiconductor layer 2, as illustrated in FIG. 7.

After forming the SInSiN film 6, the SiN film 7 is formed on the SInSiN film 6.

Figure 8:
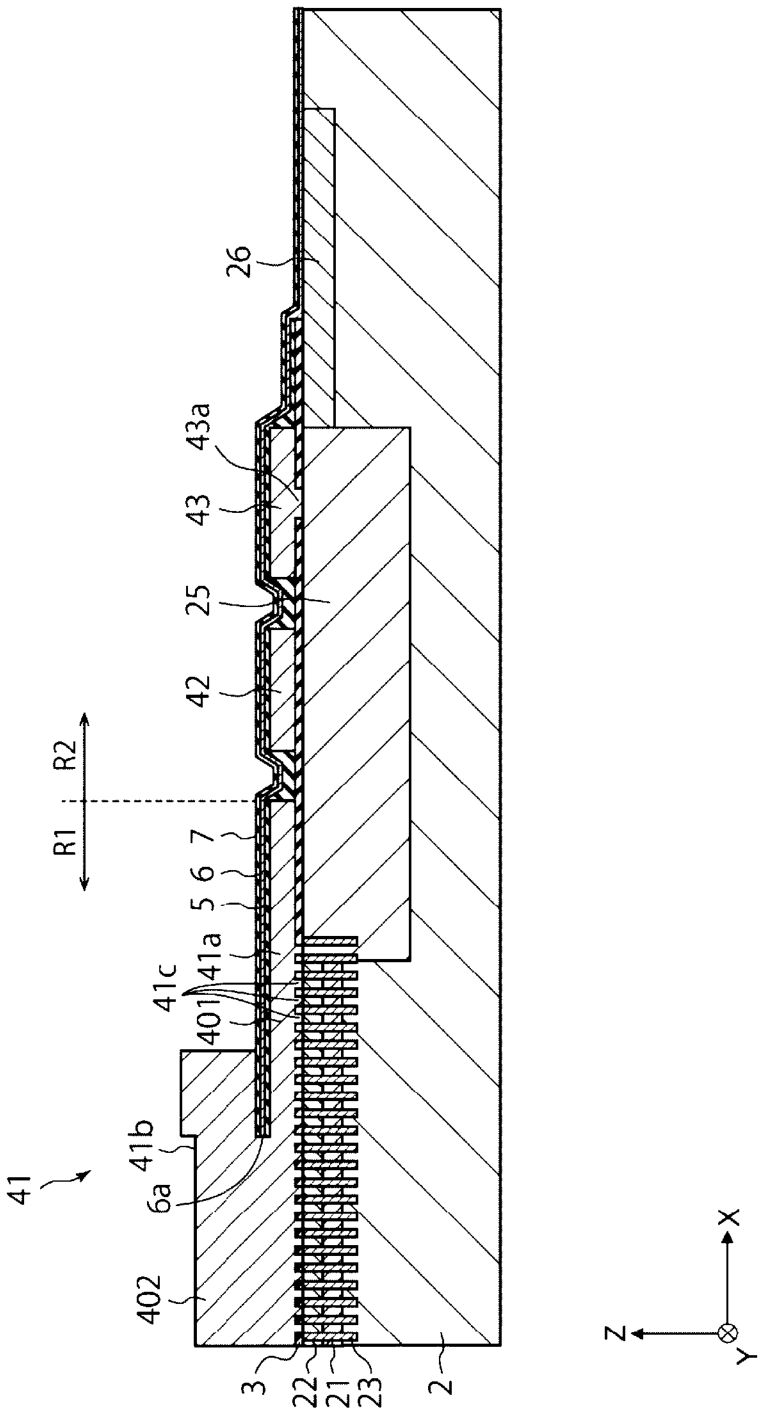

FIG. 8 is a cross-sectional view illustrating the method of manufacturing the semiconductor device according to the first embodiment subsequent to the process described in conjunction with FIG. 7. After forming the SiN film 7, the first insulating film 5, the SInSiN film 6, and the SiN film 7 are processed to expose the first conductive film 401 inside the outer edge of the element region R1, as illustrated in FIG. 8. After processing the first insulating film 5, the SInSiN film 6, and the SiN film 7, a second conductive film 402 is formed on the exposed first conductive film 401 on the element region R1, as illustrated in FIG. 8. As a result, the conductive film 4 including the emitter electrode 41 is formed. In addition, at this time, the side wall 6*a* of the SInSiN film 6 on the side closer to the element region R1 is connected to the emitter electrode 41.

Next, advantages of the semiconductor device according to the first embodiment will be described. In the first embodiment, the first insulating film 5 is provided between the SInSiN film 6 and the first conductive film 401. By providing the first insulating film 5, it is possible to prevent the reaction of Si in the SInSiN film 6 with the metal, e.g., aluminum, in the first conductive film 401 and formation of a reaction layer high in conductivity in the SInSiN film 6 at the time of forming the SInSiN film 6. Preventing an increase in the conductivity of the SInSiN film 6 can contribute to preventing a short-circuit of the conductive film 4, e.g., a short-circuit between the emitter electrode 41 and the gate interconnection 42.

Furthermore, according to a technique of the related art, the reaction between the metal in the conductive film 4 and Si in the SInSiN film 6 has been observed to be more accelerated as a refractive index of the SInSiN film 6 is higher and a temperature for forming the SInSiN film 6 is higher. However, according to the first embodiment, the first insulating film 5 is provided between the conductive film 4 and the SInSiN film 6. This can prevent the increase in the conductivity of the SInSiN film 6 even when the refractive index of the SInSiN film 6 is high and the temperature for forming the SInSiN film 6 is high. It is thereby possible to employ the SInSiN film 6 having a high refractive index, e.g., equal to or higher than 3.0 and set a high temperature, e.g., equal to or higher than 350° C. as the temperature for forming the SInSiN film 6 or a temperature for a heat treatment after forming the SInSiN film 6. According to the first embodiment, therefore, it is possible to increase options of the refractive index of the usable SInSiN film 6 and the heat treatment temperature, thereby improving a degree of freedom for designing the semiconductor device 1.

Moreover, according to the first embodiment, the first insulating film 5 covers the emitter electrode 41, the gate interconnection 42, the field plate 43, the semiconductor layer 2 between the emitter electrode 41 and the gate interconnection 42, and the semiconductor layer 2 between the gate interconnection 42 and the field plate 43. This can contribute to further preventing the short-circuit of the conductive film 4.

Second Embodiment

Next, the semiconductor device 1 where an upper surface of the SInSiN film 6 is connected to the emitter electrode according to a second embodiment will be described.

Figure 9:
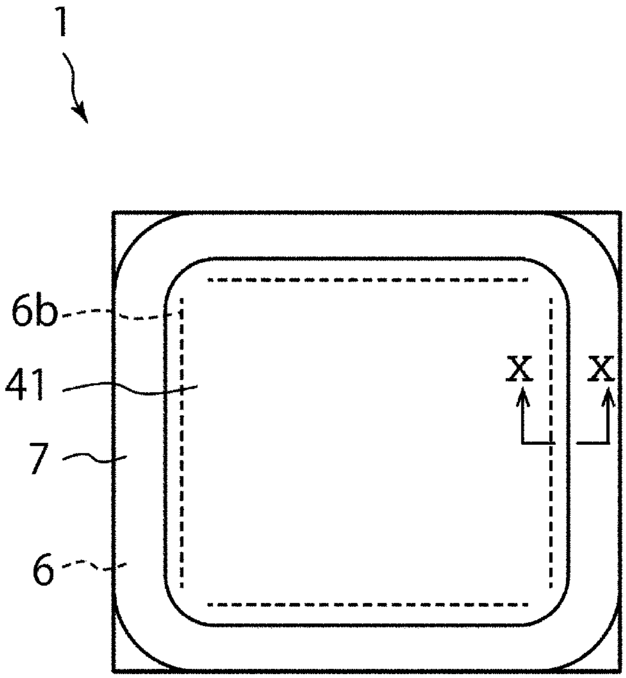
FIG. 9 is a plan view illustrating a semiconductor device according to a second embodiment.
Figure 10:
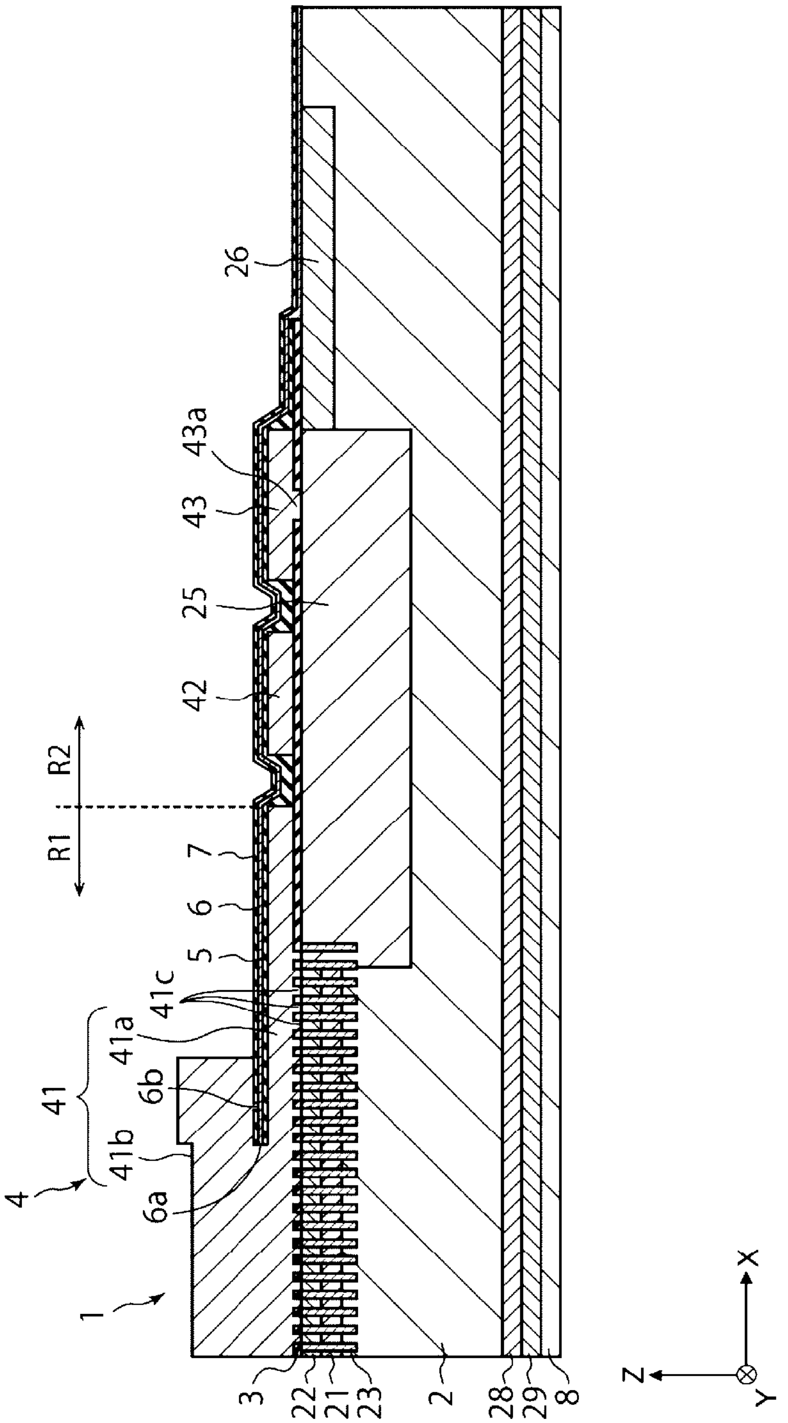
FIG. 10 is a cross-sectional view illustrating the semiconductor device according to the second embodiment.
Figure 11:
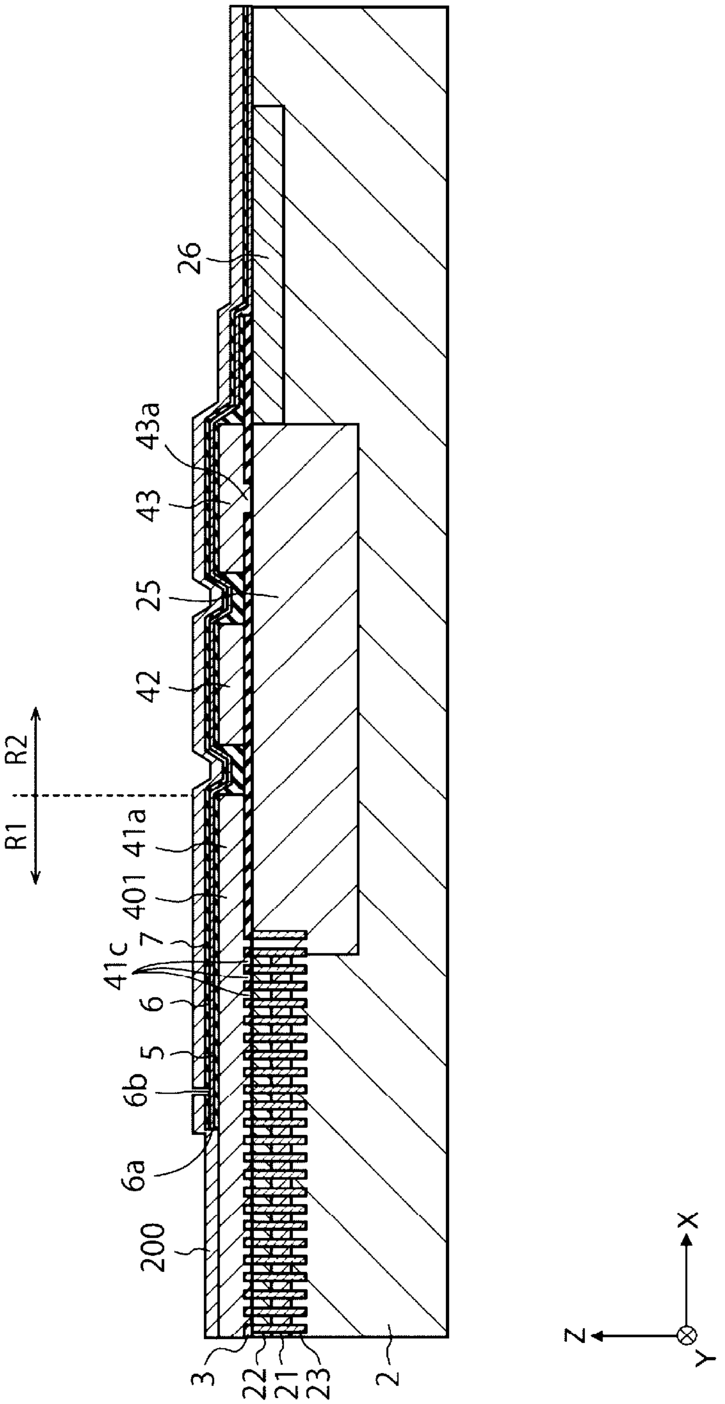
FIG. 11 is a cross-sectional view illustrating a method of manufacturing the semiconductor device according to the second embodiment.

FIG. 9 is a plan view illustrating the semiconductor device 1 according to the second embodiment. FIG. 10 is a cross-sectional view of a cross-section taken along line X-X of FIG. 9 and illustrating the semiconductor device 1 according to the second embodiment. FIG. 11 is a cross-sectional view illustrating a method of manufacturing the semiconductor device 1 according to the second embodiment.

As illustrated in FIG. 11, in the second embodiment, the SiN film 7 is provided on the SInSiN film 6 except for part of an edge of the SInSiN film 6 on the side closer to the element region R1. The SInSiN film 6 is connected to the emitter electrode 41 in the side wall 6*a* on the side closer the element region R1 and an upper surface 6*b* of part of the edge of the SInSiN film 6. As illustrated in FIG. 9, the upper surface 6*b* of part of the edge of the SInSiN film 6 has a groove shape along an outer peripheral direction of the emitter electrode 41, i.e., the boundary between the element region R1 and the termination region R2. In the example illustrated in FIG. 10, the upper surface 6*b* on part of the edge of the SInSiN film 6 is apart from the side wall 6*a* of the SInSiN film 6 on the side closer to the termination region R2. However, the disclosure is not limited to the example of FIG. 10 and the upper surface 6*b* that is continuous with the side wall 6*a* may be connected to the emitter electrode 41. This configuration can be obtained by forming the SiN film 7 so that a side wall of the SiN film 7 on the side closer to the element region R1 is located close to the termination region R2 than the side wall of the SInSiN film 6.

To manufacture the semiconductor device 1 according to the second embodiment, the SiN film 7 is processed to partially expose the upper surface 6*b* of the SInSiN film 6 before forming the conductive 402, as second film illustrated in FIG. 11. Specifically, a resist film 200 is formed on the semiconductor layer 2. After forming the resist film 200, a pattern is formed in the resist film 200 in such a manner as to expose the SiN film 7 in a range corresponding to the upper surface 6*b* of the SInSiN film 6 to be exposed from the SiN film 7, i.e., part of an edge of the SInSiN film 6, by photolithography. After forming the pattern, the SiN film 7 is etched using the resist film 200 in which the pattern is formed, as a mask.

According to the second embodiment, a connection area between the SInSiN film 6 and the emitter electrode 41 can be increased, so that it is possible to maintain the SInSiN film 6 and the emitter electrode 41 identical in potential more effectively. According to the second embodiment, therefore, it is possible to maintain the breakdown voltage of the semiconductor device 1 more effectively.

Third Embodiment

Figure 12:
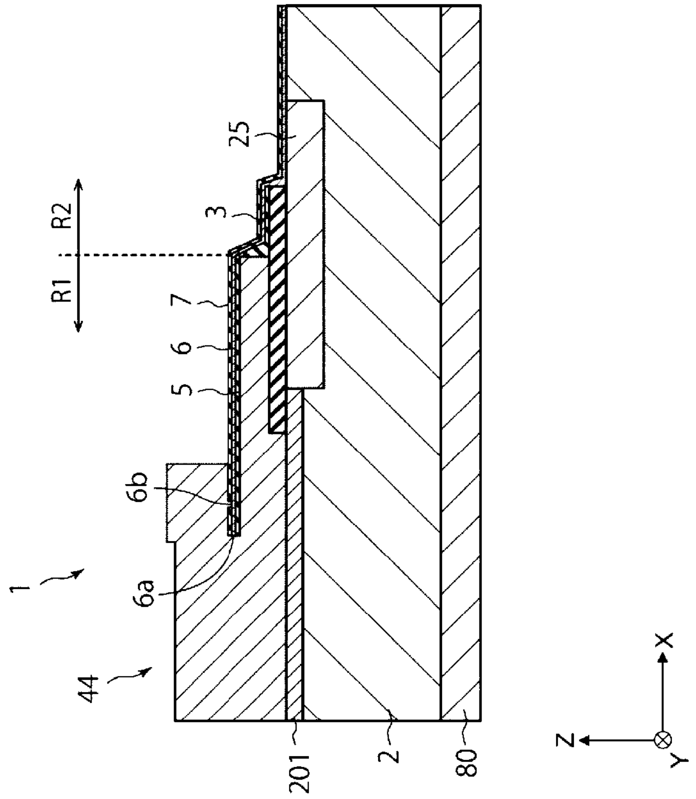
FIG. 12 is a cross-sectional view illustrating a semiconductor device according to a third embodiment.

FIG. 12 illustrates an example of application to an FRD as the semiconductor device 1 according to a third embodiment. Configurations similar to the first and second embodiments are denoted by the same reference signs as those in the first and second embodiments and are not described in detail. In the semiconductor device 1 according to the third embodiment, an impurity layer 201 (P layer) containing a P type impurity is provided on the element region R1 of the semiconductor layer 2 (N layer) containing the N type impurity. The impurity layer 201 comes in ohmic contact with an anode electrode 44 that is at least part of the conductive film 4. The first insulating film 5 is provided on part of the anode electrode 44, i.e., between part of the anode electrode 44 and the SInSiN film 6 in the portion of the element region R1 adjacent to the termination region R2. A cathode electrode 80 is disposed on a lower end of the semiconductor layer 2. The cathode electrode 80 is electrically connected to the semiconductor layer 2. That is, in the third embodiment, the semiconductor layer 2, a transistor having the anode electrode 44 and the cathode electrode 80, is provided as a semiconductor element in the element region R1. The other configurations are basically similar to those of the first and second embodiments. Similarly to the first and second embodiments, the field plate 43 that is part of the conductive film may be provided on the termination region R2 and a first conductive film 51 may be provided between the field plate 43 and the SInSiN film 6. In the semiconductor device 1 according to the third embodiment, when a forward voltage is applied between the anode electrode 44 and the cathode electrode 80, a forward current flows from the anode electrode 44 to the cathode electrode 80. When a reverse voltage is applied between the anode electrode 44 and the cathode electrode 80, a reverse current flowing from the cathode electrode 80 to the anode electrode 44 is prevented. In the FRD, the N layer in the semiconductor layer 2 is formed sufficiently thick so that reverse recovery time is shorter than that of an ordinary diode; therefore, it is possible to prevent the reverse current. The semiconductor device 1 according to the third embodiment t can prevent the increase in the conductivity of the SInSiN film 6 during the formation of the SInSiN film 6 even when the semiconductor device 1 is applied to the FRD.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a semiconductor layer having an element region where a semiconductor element is provided and a termination region surrounding the element region;

a conductive film provided on the element region and the termination region, the conductive film having a bottom surface facing the semiconductor layer and a top surface that is opposite to the bottom surface;

a first insulating film provided on the top surface of the conductive film on the termination region and on a portion of the element region adjacent to the termination region, the first insulating film being an inorganic insulating film; and a second insulating film provided on a top surface of the first insulating film on the termination region and on the portion of the element region and having a resistivity lower than a resistivity of the first insulating film and higher than a resistivity of the conductive film.

2. The semiconductor device according to claim 1, further comprising a third insulating film provided on the second insulating film except for a part of the second insulating film on a side closer to the element region, wherein a side wall of the second insulating film on the side closer to the element region and an upper surface of the part of the second insulating film are in contact with the conductive film.

3. The semiconductor device according to claim 2, wherein the third insulating film is provided on the second insulating film between the side wall and the upper surface.

4. The semiconductor device according to claim 1, further comprising a third insulating film provided on the second insulating film except for an edge of the second insulating film on a side closer to the element region, wherein a side wall of the second insulating film on the side closer to the element region is in contact with the conductive film.

5. The semiconductor device according to claim 1, wherein the conductive film includes a first electrode provided on the element region.

6. The semiconductor device according to claim 5, wherein the second insulating film is provided on the first insulating film and on the semiconductor layer, and is in contact with the semiconductor layer at positions farther from the element region than the first insulating film.

7. The semiconductor device according to claim 5, wherein the conductive film further includes an interconnection part that is provided on the termination region, electrically isolated from the first electrode, and is electrically connected to a second electrode provided in the element region.

8. The semiconductor device according to claim 7, wherein the first insulating film is provided on the first electrode, the interconnection part, and the semiconductor layer between the first electrode and the interconnection part.

9. The semiconductor device according to claim 1, wherein the second insulating film is a semi-insulating silicon nitride film.

10. The semiconductor device according to claim 1, further comprising:

a third insulating film provided on the second insulating film except for a part of the second insulating film on a side closer to the element region, wherein an upper surface of the part of the second insulating film are in contact with the conductive film, and the third insulating film is provided between a side wall of the second insulating film on the side closer to the element region and the upper surface.

11. A semiconductor device comprising:

a semiconductor layer having an element region where a semiconductor element is provided and a termination region surrounding the element region;

a conductive film provided on the element region and the termination region, the conductive film having a bottom surface facing the semiconductor layer and a top surface that is opposite to the bottom surface;

a first insulating film provided on the top surface of the conductive film on the termination region and on a portion of the element region adjacent to the termination region, the first insulating film being an inorganic insulating film;

a second insulating film, which is in direct contact with the conductive film, provided on a top surface of the first insulating film on the termination region and on the portion of the element region and having a resistivity lower than a resistivity of the first insulating film and higher than a resistivity of the conductive film; and a third insulating film provided on the second insulating film and having a resistivity higher than the resistivity of the second insulating film.

12. The semiconductor device according to claim 11, wherein the second insulating film is in direct contact with the semiconductor layer in the termination region and not in direct contact with the semiconductor layer in the element region.

13. The semiconductor device according to claim 11, wherein the second insulating film is in direct contact with the conductive film at an edge of the second insulating film that is farthest from the termination region.

14. The semiconductor device according to claim 13, wherein the edge of the second insulating film that is in direct contact with the conductive film is between the first insulating layer and the third insulating layer.

15. The semiconductor device according to claim 14, wherein the third insulating film includes first and second portions, and the second insulating film is in further direct contact with the conductive film between the first and second portions of the third insulating film.

16. The semiconductor device according to claim 13, wherein a side of the edge of the second insulating film and an upper surface of the edge of the second insulating film are in direct contact with the conductive film.

17. The semiconductor device according to claim 13, wherein the first and third insulating films extend to a position overlapping the edge of the second insulating film in a direction perpendicular to the top surface of the first insulating film.

18. The semiconductor device according to claim 11, wherein the semiconductor element is an insulated gate bipolar transistor.

19. The semiconductor device according to claim 11, wherein the semiconductor element is a fast recovery diode.

20. A semiconductor device comprising:

a semiconductor layer having an element region where a semiconductor element is provided and a termination region surrounding the element region;

a conductive film provided on the element region and the termination region, the conductive film having a bottom surface facing the semiconductor layer and a top surface that is opposite to the bottom surface;

a first insulating film provided on the top surface of the conductive film on the termination region and on a portion of the element region adjacent to the termination region;

a second insulating film provided on a top surface of the first insulating film and having a resistivity lower than a resistivity of the first insulating film and higher than a resistivity of the conductive film; and a third insulating film provided on the second insulating film except for an edge of the second insulating film on a side closer to the element region, wherein a side wall of the second insulating film on the side closer to the element region is in contact with the conductive film, and the second insulating film is farther from the semiconductor layer than the first insulating film, and the third insulating film is farther from the semiconductor layer than the second insulating film.

* * * * *